United States Patent
Arizono

(10) Patent No.: US 8,456,920 B2
(45) Date of Patent: Jun. 4, 2013

(54) SEMICONDUCTOR MEMORY DEVICE CAPABLE OF EXECUTING HIGH-SPEED PAGE COPY

(75) Inventor: Daisuke Arizono, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 106 days.

(21) Appl. No.: 13/052,155

(22) Filed: Mar. 21, 2011

(65) Prior Publication Data

US 2011/0249509 A1      Oct. 13, 2011

(30) Foreign Application Priority Data

Apr. 9, 2010   (JP) ................. 2010-090887

(51) Int. Cl.
*G11C 16/04*     (2006.01)

(52) U.S. Cl.
USPC ............. 365/185.25; 365/185.08; 365/185.18

(58) Field of Classification Search
USPC ........................... 365/185.25, 185.18, 185.05
See application file for complete search history.

(56) References Cited

U.S. PATENT DOCUMENTS

| | | | | |
|---|---|---|---|---|
| 5,982,675 A * | 11/1999 | Fujimoto | ................. | 365/189.05 |
| 7,245,528 B2 | 7/2007 | Shibata et al. | | |
| 7,245,533 B2 * | 7/2007 | Shibata | .................... | 365/185.17 |
| 7,653,780 B2 * | 1/2010 | Takahashi | ..................... | 711/106 |
| 7,916,534 B2 * | 3/2011 | Shimizu et al. | .......... | 365/185.03 |
| 8,004,889 B2 * | 8/2011 | Shibata | .................... | 365/185.03 |

FOREIGN PATENT DOCUMENTS

JP         2005-243205          9/2005

* cited by examiner

*Primary Examiner* — Pho M Luu
(74) *Attorney, Agent, or Firm* — Oblon, Spivak, McClelland, Maier & Neustadt, L.L.P.

(57) ABSTRACT

A semiconductor memory device includes a memory cell array, first and second data caches, and a control circuit. The control circuit is configured to control, with use of the first and second data caches, a read operation of reading data from the selected memory cell of the memory cell array, and a write operation of writing data in the selected memory cell of the memory cell array. The control circuit is configured to execute, at a time of the read operation, an arithmetic operation of the data held in the first data cache by using the first and second data caches, and to generate the data which is to be written in the selected memory cell.

18 Claims, 17 Drawing Sheets

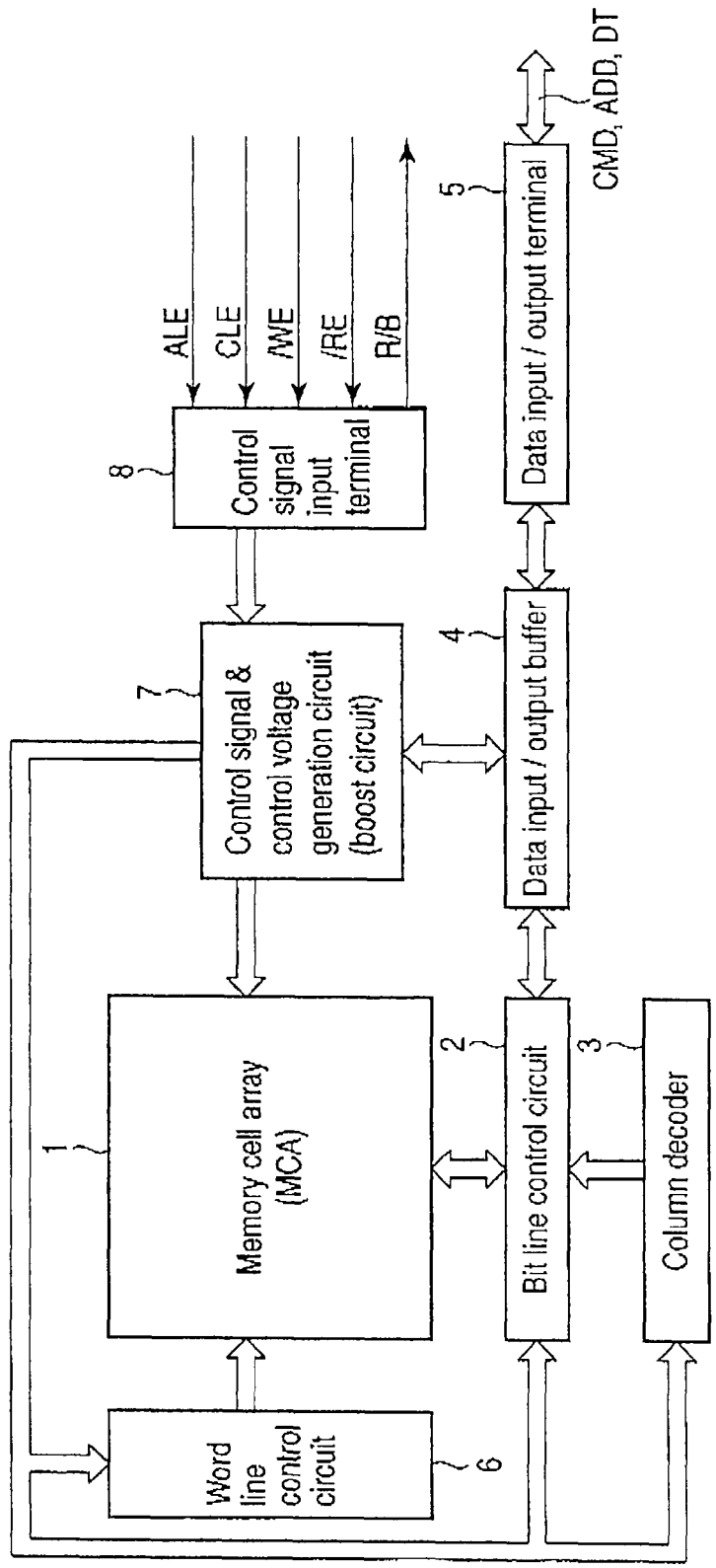
F I G. 1

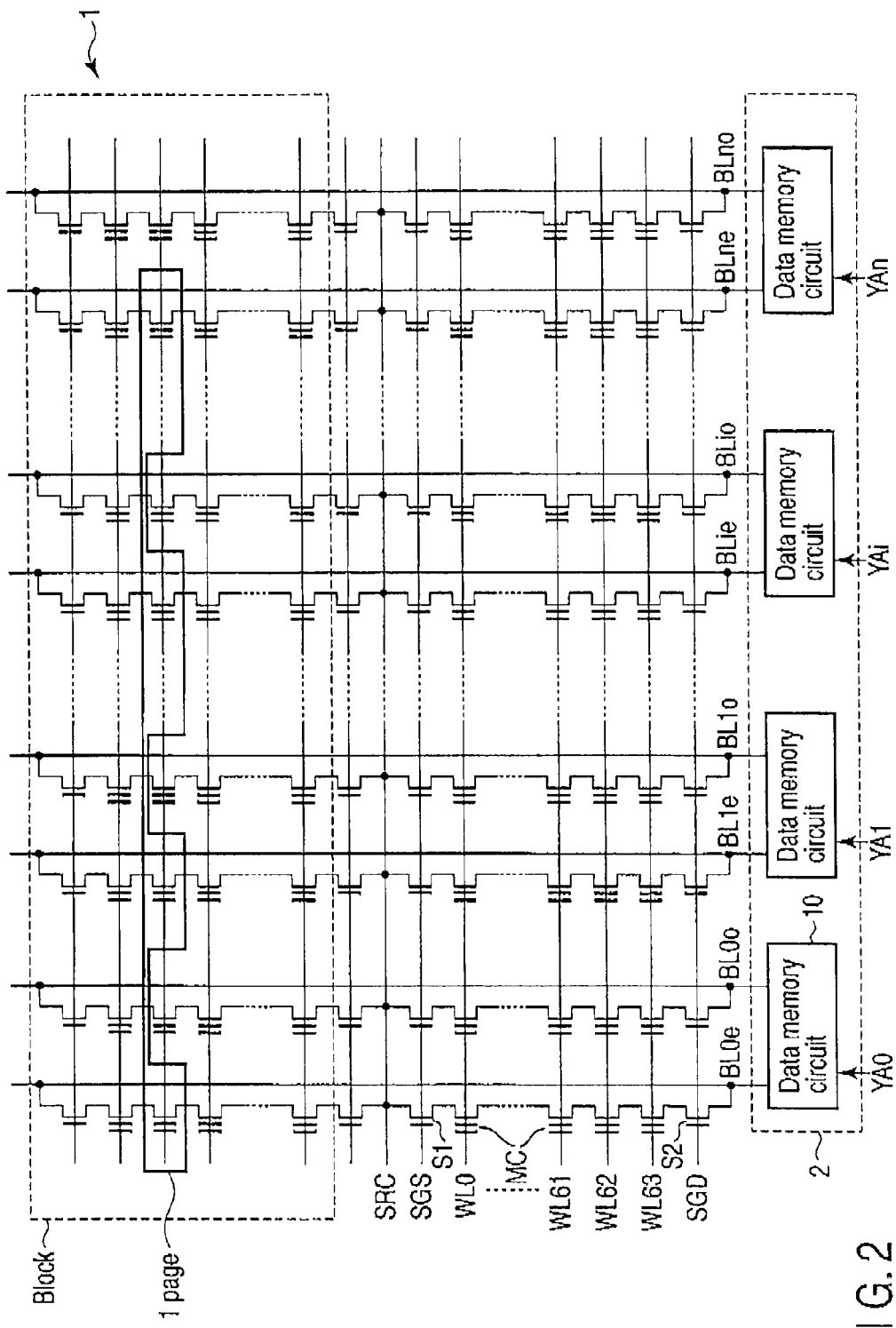
F I G. 2

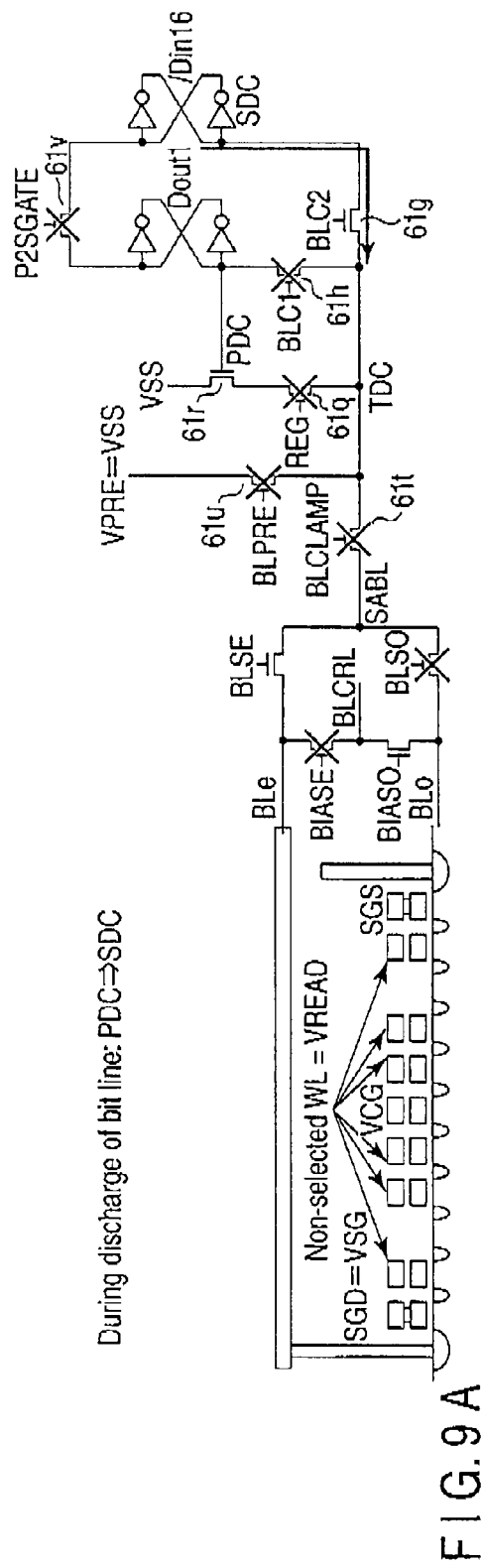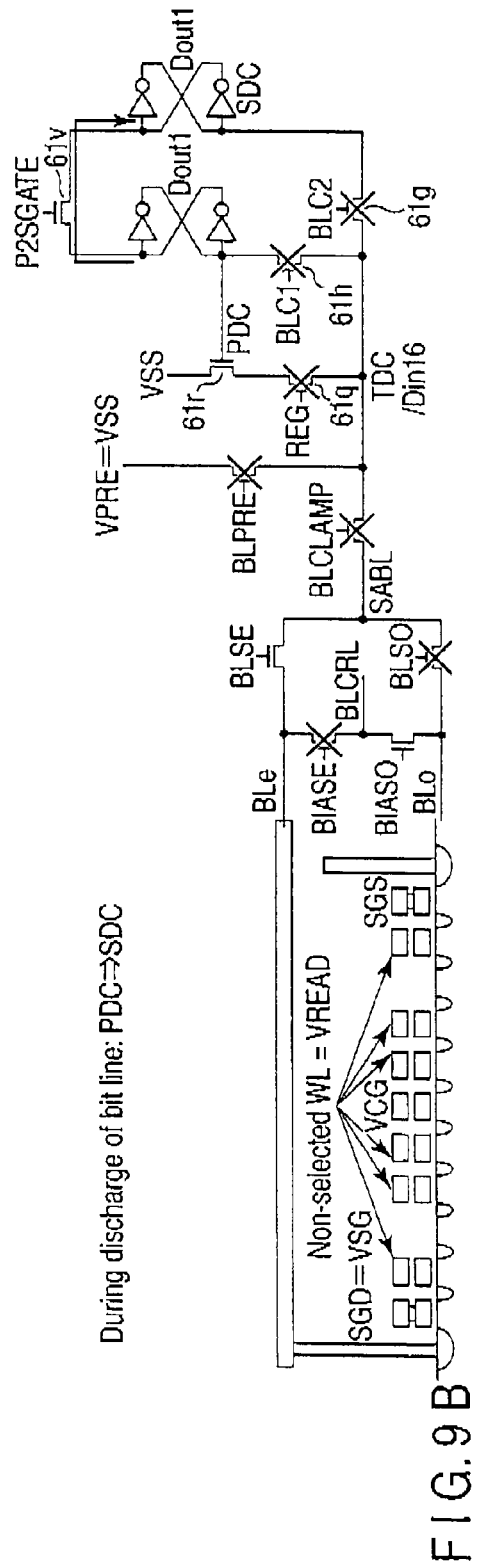

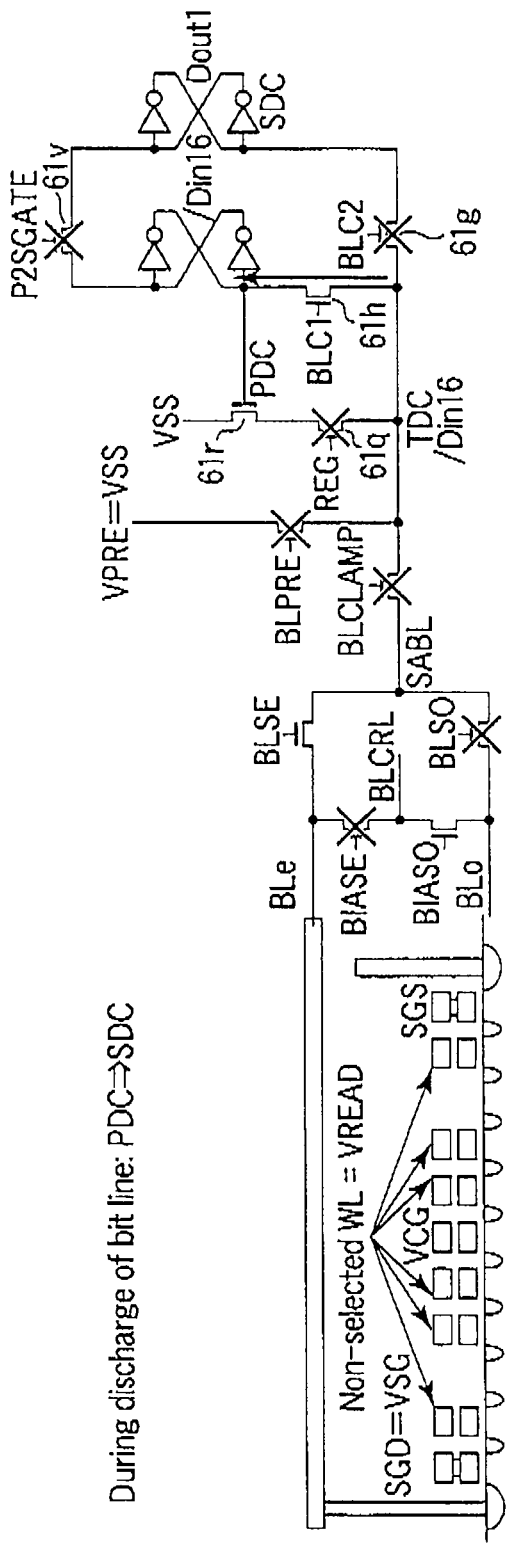
F I G. 9C

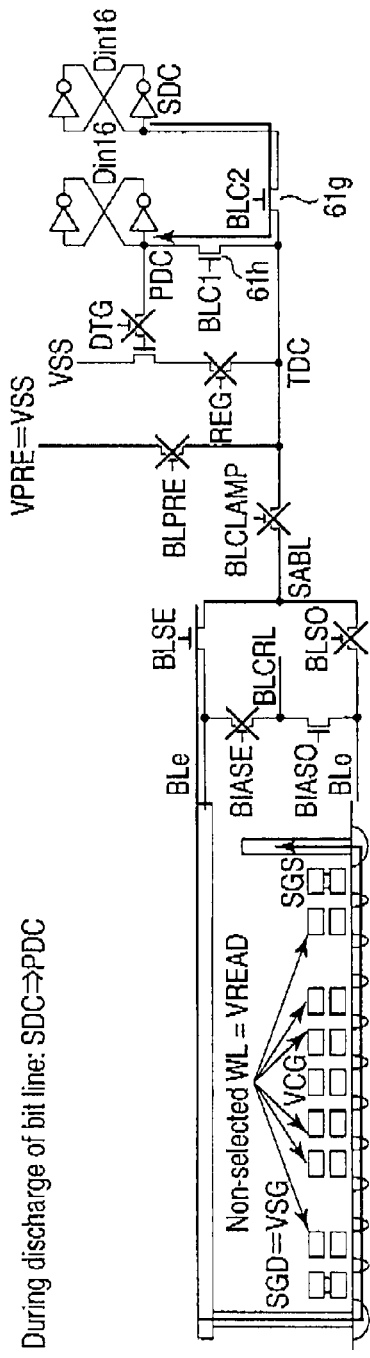
F I G. 11C
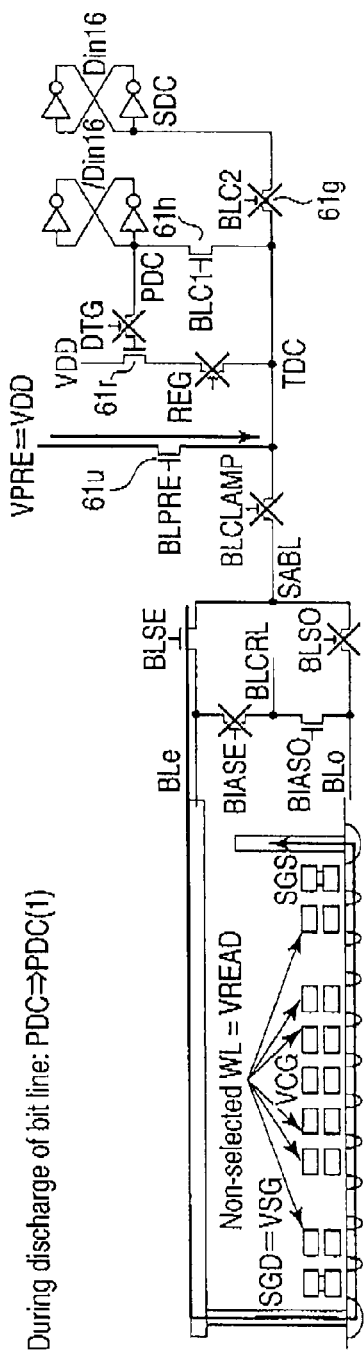
F I G. 12A

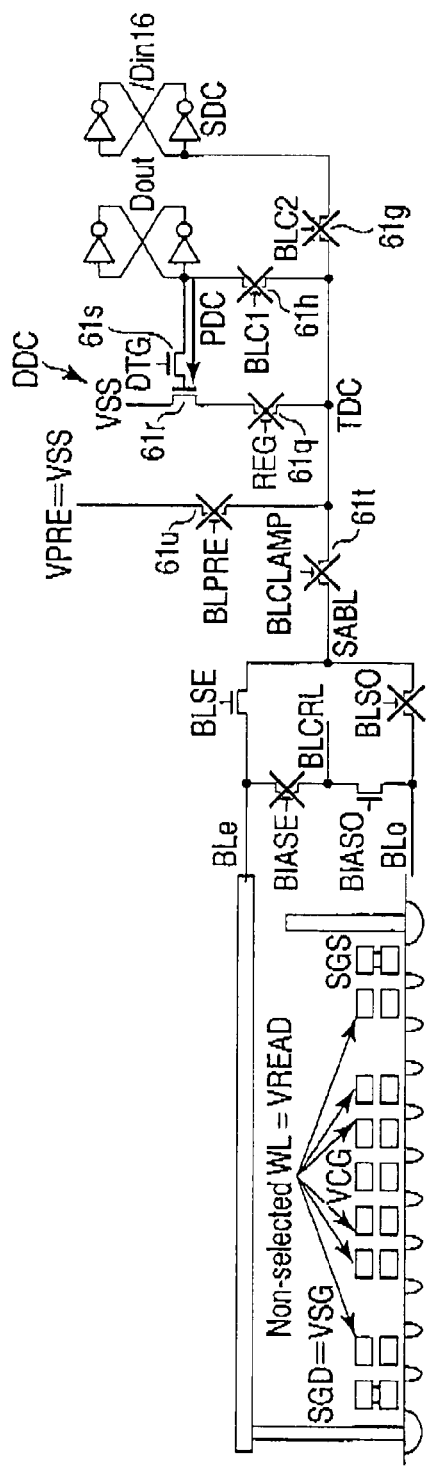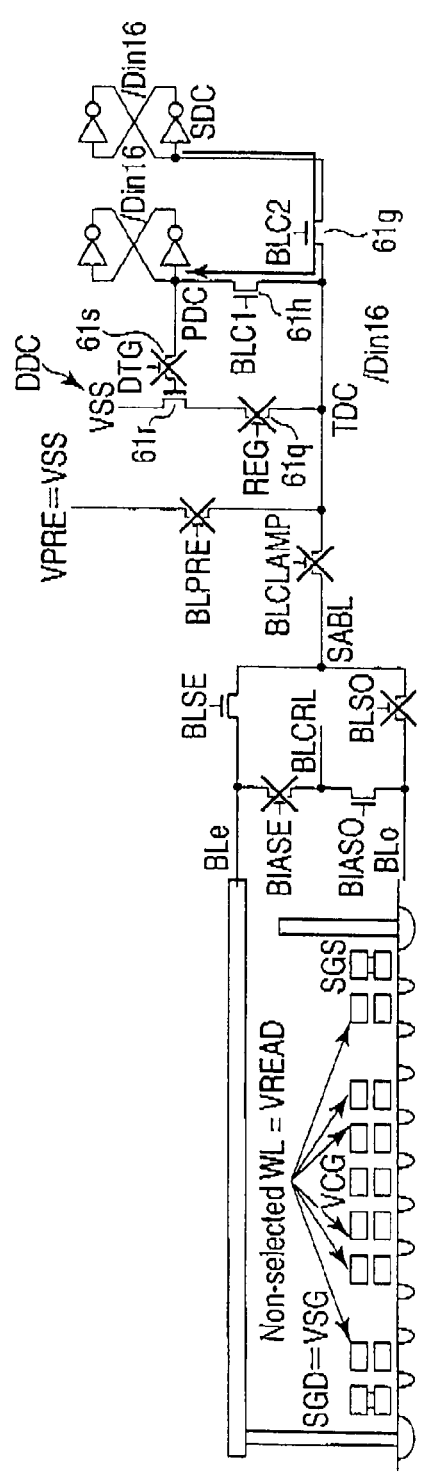
F I G. 13 A
F I G. 13 B

SEMICONDUCTOR MEMORY DEVICE CAPABLE OF EXECUTING HIGH-SPEED PAGE COPY

CROSS-REFERENCE TO RELATED APPLICATIONS

This application is based upon and claims the benefit of priority from Japanese Patent Application No. 2010-090887, filed Apr. 9, 2010; the entire contents of which are incorporated herein by reference.

FIELD

Embodiments described herein relate generally to a semiconductor memory device, for example, a NAND flash memory, and a method of controlling the semiconductor memory device.

BACKGROUND

Recently, NAND flash memories have been used in various electronic devices. The NAND flash memory comprises, for example, a plurality of blocks. Each of the blocks comprises a plurality of pages. Each of the pages comprises a plurality of memory cells. In the NAND flash memory, data write and data read are executed in units of a page.

Within one block, data of a certain page can be copied to another page in the same block (hereinafter referred to as "page copy"). In the page copy operation, for example, data of a certain page address is read out, and the read-out data is transferred to the outside.

Then, another page address and write data which is to be written at this another page address (i.e. the data which has been read out from the certain page address) are input from the outside. This data is inverted in the NAND flash memory, and converted to write data. This converted data is written at this another page address.

BRIEF DESCRIPTION OF THE DRAWINGS

FIG. 1 schematically shows the structure of a semiconductor memory device according to a first embodiment.
FIG. 2 is a circuit diagram showing a part of FIG. 1.
FIGS. 9A, 9B and 9C concretely illustrate a page copy operation which follows the page copy operation illustrated in FIG. 8O.
FIGS. 11A, 11B and 11C concretely illustrate a page copy operation according to the second embodiment.
FIGS. 12A, 12B and 12C concretely illustrate a page copy operation which follows the page copy operation illustrated in FIG. 11C.
FIGS. 13A, 13B, 13C and 13D concretely illustrate a page copy operation which follows the page copy operation illustrated in FIG. 12C.

DETAILED DESCRIPTION

Figure 3:
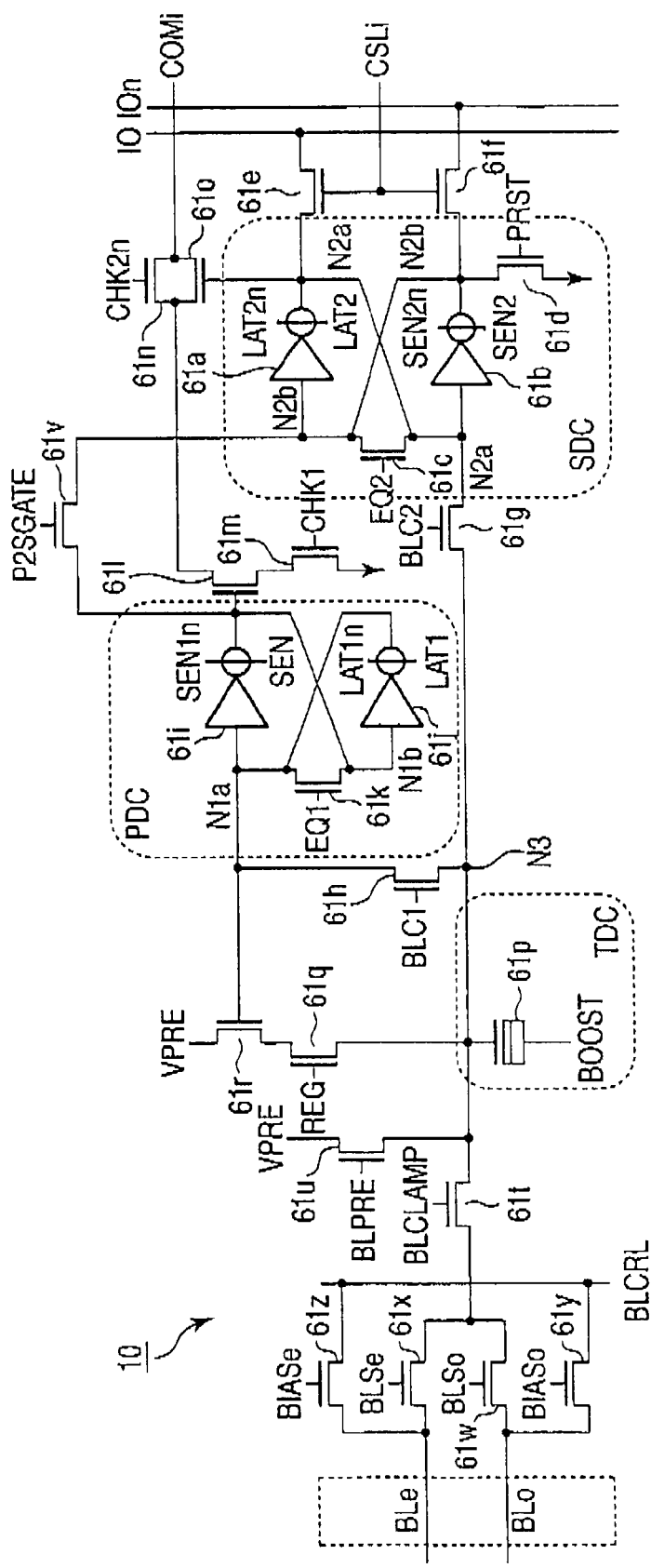
FIG. 3 is a circuit diagram showing a part of FIG. 2.

In general, according to one embodiment, a semiconductor memory device includes a memory cell array, first and second data caches, and a control circuit. The memory cell array includes a plurality of memory cells, and a plurality of word lines and a plurality of bit lines, which are connected to the memory cells. The first and second data caches are configured to hold data which is read out from a selected memory cell of the memory cell array, and data which is to be written in a selected memory cell of the memory cell array. The control circuit is configured to control, with use of the first and second data caches, a read operation of reading data from the selected memory cell of the memory cell array, and a write operation of writing data in the selected memory cell of the memory cell array. The control circuit is configured to execute, in the read operation, an arithmetic operation of the data held in the first data cache by using the first and second data caches, and to generate the data which is to be written in the selected memory cell.

Embodiments will now be described with reference to the accompanying drawings.

First Embodiment

FIG. 1 shows the structure of a NAND flash memory serving as a semiconductor memory device which stores, e.g. binary data (1 bit) in a memory cell.

A memory cell array 1 includes a plurality of bit lines, a plurality of word lines, and common source lines. In the memory cell array 1, electrically data rewritable memory cells, which are composed of, e.g. EEPROM cells, are arranged in a matrix. A bit line control circuit 2 for controlling the bit lines and a word line control circuit 6 are connected to the memory cell array 1.

The bit line control circuit 2 executes such operations as reading out data in memory cells in the memory cell array 1 via the bit lines, detecting the states of the memory cells in the memory cell array 1 via the bit lines, and writing data in the memory cells by applying a write control voltage to the memory cells in the memory cell array 1 via the bit lines.

A column decoder 3 and a data input/output buffer 4 are connected to the bit line control circuit 2. Data memory circuits (to be described later) in the bit line control circuit 2 are selected by the column decoder 3. The data of the memory cell, which has been read out by the data memory circuit, is output to the outside from a data input/output terminal 5 via the data input/output buffer 4.

The data input/output terminal 5 receives various commands CMD, addresses ADD and data DT, which are supplied from the outside of the memory chip. The write data, which has been input by the data input/output terminal 5, is supplied via the data input/output buffer 4 to the data memory circuit which has been selected by the column decoder 3. The commands and address are supplied to a control signal & control voltage generation circuit 7.

The word line control circuit 6 is connected to the memory cell array 1. The word line control circuit 6 selects a word line in the memory cell array 1, and applies a voltage, which is necessary for read, write or erase, to the selected word line.

The memory cell array 1, bit line control circuit 2, column decoder 3, data input/output buffer 4 and word line control circuit 6 are connected to the control signal & control voltage generation circuit 7 and are controlled by this control signal & control voltage generation circuit 7. The control signal & control voltage generation circuit 7 is connected to a control signal input terminal 8 and is controlled by control signals ALE (address latch enable), CLE (command latch enable), /WE (write enable), /RE (read enable) and R/B (ready/busy). The control signal & control voltage generation circuit 7 includes a boost circuit such as a charge pump circuit, and generates voltages of the word lines and bit lines at the time of data write, and control signals which control the data memory circuits.

The bit line control circuit 2, column decoder 3, word line control circuit 6 and control signal & control voltage generation circuit 7 constitute a write circuit and a read circuit.

FIG. 2 shows an example of the structure of the memory cell array 1 and bit line control circuit 2 shown in FIG. 1. A plurality of NAND units are disposed in the memory cell array 1. One NAND unit comprises memory cells MC, which are composed of, e.g. 64 EEPROMs that are connected, for example, in series; and select gates S1 and S2. The select gate S2 is connected to a bit line BLOB, and the select gate S1 is connected to a source line SRC. The control gates of the memory cells MC, which are disposed in each row, are commonly connected to the word line, WL0 to WL63. In addition, the select gates S2 are commonly connected to a select line SGD, and the select gates S1 are commonly connected to a select line SGS.

The bit line control circuit 2 includes a plurality of data memory circuits 10. A pair of bit lines (BL0e, BL0o), (BL1e, BL1o), . . . , (BLie, BLio), (BLne, BLno), are connected to each of the data memory circuits 10.

The memory cell array 1 includes a plurality of blocks, as indicated by a broken line. Each block comprises a plurality of NAND units. For example, data is erased in units of a block. In addition, the erase operation is executed at the same time for two bit lines connected to the data memory circuit 10.

A plurality of memory cells (memory cells in a range surrounded by a broken line), which are disposed in every other bit line and are connected to one word line, constitute a page. Data is written and read in units of a page. Specifically, half the number of memory cells, which are connected in the row direction, are connected to the associated bit lines. Thus, a write operation or a read operation is executed in units of a half of the memory cells which are disposed in the row direction.

At the time of the data read operation, program verify operation and program operation, one of the two bit lines (BLie, BLio), which are connected to the data memory circuit 10, is selected in accordance with an address signal (YA0, YA1, . . . , YAi, YAn) which is supplied from the outside. In addition, one word line is selected in accordance with an external address, and thus one page indicated by the broken line is selected.

FIG. 3 is a circuit diagram showing an example of the data memory circuit 10 shown in FIG. 1 and FIG. 2.

The data memory circuit 10 includes, for example, a primary data cache (PDC), a secondary data cache (SDC) and a temporary data cache (TDC). The SDC and PDC store, for example, input data at time of write, and read data at time of read. Further, the SDC and PDC are used for operations of internal data, such as conversion arithmetic operations of write data. The TDC amplifies and temporarily stores data of a bit line at a time of data read, and is used for an operation of internal data.

The SDC comprises clocked inverter circuits 61a and 61b which constitute a latch circuit, and transistors 61c and 61d. The transistor 61c is connected between an input terminal of the clocked inverter circuit 61a and an input terminal of the clocked inverter circuit 61b. The gate of the transistor 61c is supplied with a signal EQ2. The transistor 61d is connected between an output terminal of the clocked inverter circuit 61b and a ground. The gate of the transistor 61d is supplied with a signal PRST.

A node N2a of the SDC is connected to an input/output data line IO via a column select transistor 61e, and a node N2b is connected to an input/output data line IOn via a column select transistor 61f. The gates of the transistors 61e and 61f are supplied with a column select signal CSLi.

The node N2a of the SDC is connected to a node N1a of the PDC via transistors 61g and 61h. The gate of the transistor 61g is supplied with a signal BLC2, and the gate of the transistor 61h is supplied with a signal BLC1.

The PDC comprises clocked inverter circuits 61i and 61j, and a transistor 61k. The transistor 61k is connected between an input terminal of the clocked inverter circuit 61i and an input terminal of the clocked inverter circuit 61j. The gate of the transistor 61k is supplied with a signal EQ1.

A node N1b of the PDC is connected to the gate of a transistor 61l. One end of the current path of the transistor 61l is grounded via a transistor 61m. The gate of the transistor 61m is supplied with a signal CHK1. The other end of the current path of the transistor 61l is connected to one end of the current path of each of transistors 61n and 61o which constitute a transfer gate. The gate of the transistor 61n is supplied with a signal CHK2n. The gate of the transistor 61o is connected to an output terminal of the clocked inverter circuit 61a.

The other end of the current path of each of the transistors 61n and 61o is connected to a line COMi. The line COMi is a line common to all data memory circuits 10. When verify of all data memory circuits 10 is completed, the potential of the line COMi rises to a high level. Specifically, when verify is completed, the node N1b of the PDC is set at a low level. In this state, if the signals CHK1 and CHK2n are set at a high level, the potential of the line COMi is set at the high level in the case where the verify has been completed.

Further, the node N1b of the PDC is connected to the node N2b of the SDC via the transistor 61v. The gate of the transistor 61v is supplied with a signal P2SGATE. The transistor 61v, as will be described later, is used for a data exchange operation between data of the PDC and data of the SDC.

On the other hand, the TDC comprises, e.g. a MOS capacitor 61p. One end of the capacitor 61p is connected to a connection node N3 of the transistors 61g and 61h, and the other end of the capacitor 61p is supplied with a signal BOOST.

The connection node N3 is connected to one end of a transistor 61r via a transistor 61q. The gate of the transistor 61q is supplied with a signal REG, and the other end of the current path of the transistor 61r is supplied with a signal VPRE. The gate of the transistor 61r is connected to the node N1a of the PDC.

Moreover, the connection node N3 is connected to one end of the current path of each of transistors 61t and 61u. The other end of the current path of the transistor 61u is supplied with a signal VPRE, and the gate of the transistor 61u is supplied with BLPRE. The gate of the transistor 61t is supplied with a signal BLCLAMP. The other end of the current path of the transistor 61t is connected to one end of a bit line BLo via a transistor 61w, and to one end of a bit line BLe via a transistor 61x.

The one end of the bit line BLo is connected to one end of the current path of a transistor 61y. The gate of the transistor 61y is supplied with a signal BIASo. The one end of the bit line BLe is connected to one end of the current path of a transistor 61z. The gate of the transistor 61z is supplied with a signal BIAS. The other end of the current path of each of the transistors 61y and 61z is supplied with a signal BLCRL. The transistors 61y and 61z are turned on complementarily to the transistors 61w and 61x in accordance with the signals BIASo and BIASe, and supply the potential of the signal BLCRL to a non-selected bit line.

The respective signals and voltages shown in FIG. 3 are generated by the control signal & control voltage generation circuit 7 shown in FIG. 1. Based on the control of the control signal & control voltage generation circuit 7, the operation of the data memory circuit 10 is controlled.

(General Page Copy Operation)

To begin with, referring to FIG. 4A to FIG. 4G, a general page copy operation is described. FIG. 4A to FIG. 4G illustrate successive operations of data read and data program in a case where data of page addresses PA0, 1, . . . , for instance, is copied to page addresses PA16, 17, . . . .

Figure 4:
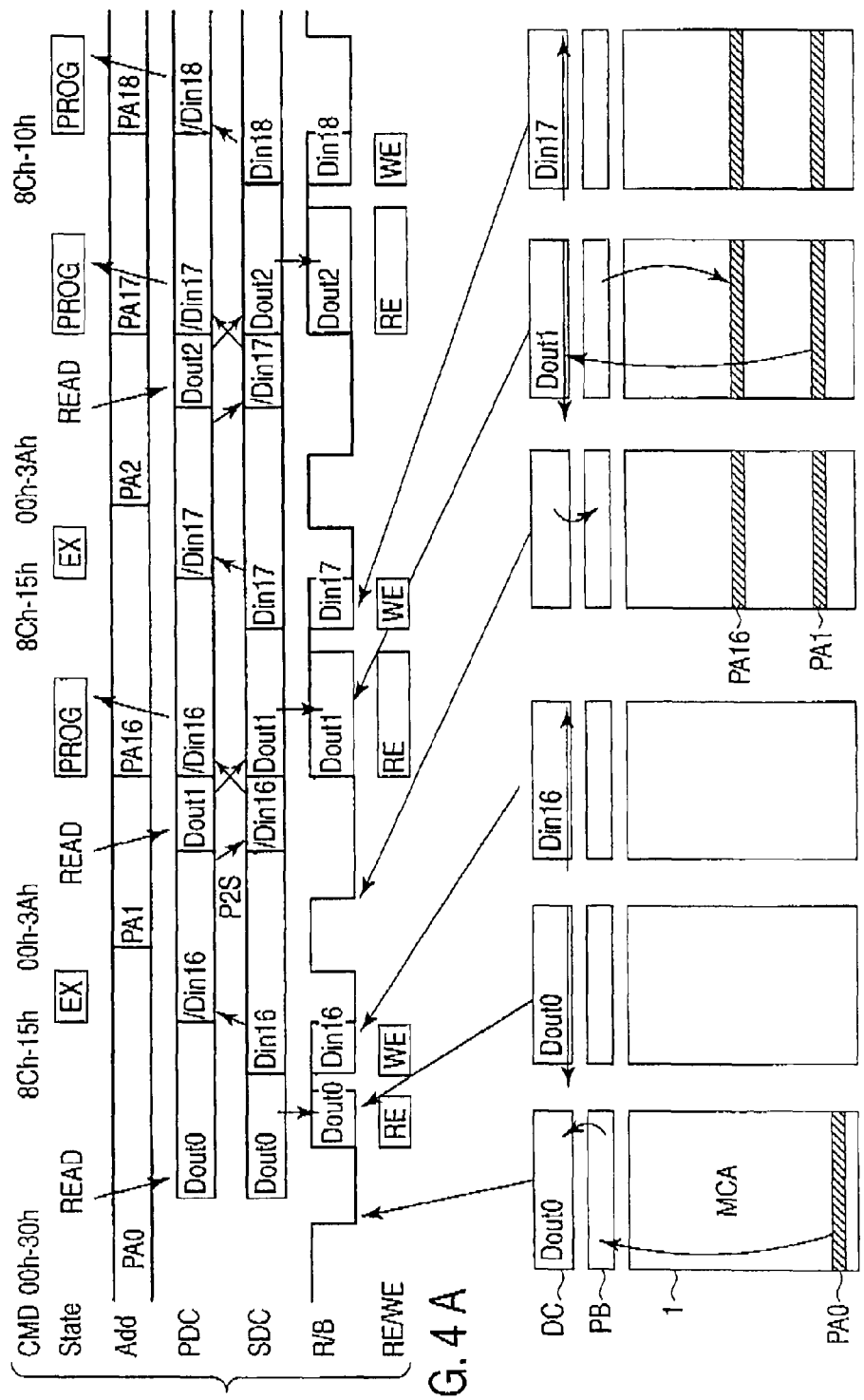
FIGS. 4A, 4B, 4C, 4D, 4E, 4F and 4G illustrate a general page copy operation.

The meanings of commands CMD in FIG. 4A are as follows. It should be noted that "h" indicates a hexadecimal numeral.

Commands "00h-30h" are read commands, and read addresses are input between command "00" and command "30".

Commands "8Ch-15h" are auto-program commands which involve an operation of a data cache during page copy, and addresses and data are input between command "8Ch" and command "15h".

Commands "00h-3Ah" are read commands which involve data output during page copy. Read addresses are input between command "00" and "3A", and read data is output to the outside.

Commands "8Ch-10h" are auto-program commands of the last page during page copy, and addresses and data are input between command "8Ch" and "15h".

FIG. 4A illustrates a timing of a page copy operation, and FIG. 4B to FIG. 4G illustrate operations of a memory cell array MCA, a page bugger PB and a data cache DC.

In FIG. 4A, the command CMD indicates commands which are supplied from the outside of the memory chip, and the state "State" indicates that the operation state in the data memory circuit 10. The address Add indicates the address of the memory cell array, and R/B indicates a ready/busy signal. When the ready/busy signal is at a low level, the busy state is indicated. RE/WE indicates a period in which read enable/write enable is toggled.

In FIG. 4B to FIG. 4G, the page buffer PB is composed of PDCs of data memory circuits for one page, and the data cache DC is composed of SDCs of data memory circuits for one page.

As shown in FIG. 4A and FIG. 4B, in the page copy, to start with, if the R/2 is set at a low level (busy), based on the read commands "00h-30h", the data of a page address PA0 is read out from the memory cell array MCA. The read-out data is transferred to the data cache DC via the page buffer PB. Then, if the R/B rises to a high level (ready), the data of the data cache DC is transferred to the outside (FIG. 4C).

Next, based on the commands "8Ch-15h", a page address PA16 and data Din16, which is to be written at the data address PA16, are supplied, and the data Din16 is input to the data cache DC (FIG. 4D). The data Din16 is, for example, data Dout0 which is read out from the page address PA0 to the outside. In the case where error correction of the data Dout0 is performed by an ECC (Error Checking and Correcting) circuit, which is provided in, e.g. a controller on the outside of the NAND flash memory, data after error correction may be input as Din16.

Subsequently, if the R/B is set at the low level, the data Din16 of the data cache DC is inverted and transferred to the page buffer PB (FIG. 4E). Specifically, an inversion arithmetic operation of input data is performed, and write data /Din16 is generated. If the data Din16 is inverted and transferred to the page buffer PB, the R/B rises to the high level.

Thereafter, based on the commands "00h-3Ah", data Dout1 of the page address PA1 is read out from the memory cell array MCA to the page buffer P. Specifically, the write data /Din16 of the page buffer PB is transferred to the data cache DC, and the data Dout1, which is read out from the memory cell array MCA, is retained in the page buffer PB.

Further, the data Dout1 of the page buffer PB and the write data /Din16 of the data cache DC are exchanged, and the write data /Din16 of the page buffer PB is written in the memory cell array MCA. While the write data /Din16 is being written in the memory cell MCA, the data Dout1 of the data cache DC is output (FIG. 4F).

Subsequently, based on commands "80h-15h", the write data Din17, which is to be written at an address PA17, is input to the data cache DC (FIG. 4G). The data Din17 is, for example, the data Dout1 which is read out from the page address PA1 to the outside. In the case where error correction of the data Dout1 is performed by an ECC (Error Checking and Correcting) circuit, which is provided in, e.g. a controller on the outside of the NAND flash memory, data after error correction may be input as Din17.

Subsequently, in the same manner as described above, the page copy operation is executed.

In the case of the page copy operation illustrated in FIG. 4A to FIG. 4G, after the arithmetic operation for converting the input data Din16 to the write data /Din16 as illustrated in FIG. 4D and FIG. 4E, the read operation of the next page address PA1 is executed, and then program of the write data /Din16 is executed. Specifically, in the case of the page copy operation illustrated in FIG. 4A to FIG. 4G, the operation of "arithmetic operation-read-program" is repeated. Thus, in the page copy operation in which data read and program are repeated, the time for the arithmetic operation for converting input data to write data is additionally consumed.

(Page Copy Operation of First Embodiment)

In the page copy operation of the first embodiment, the arithmetic operation for converting input data to write data is executed at the same time as data read during the data read operation. Thereby, the time of the page copy operation is reduced.

FIG. 5A to FIG. 5G illustrate the page copy operation of the first embodiment. Like FIG. 4A to FIG. 4G, FIG. 5A to FIG. 5G illustrate successive operations of data read and data program in a case where data of page addresses PA0, 1, . . . , for instance, is copied to page addresses PA16, 17, . . . .

Figure 5:
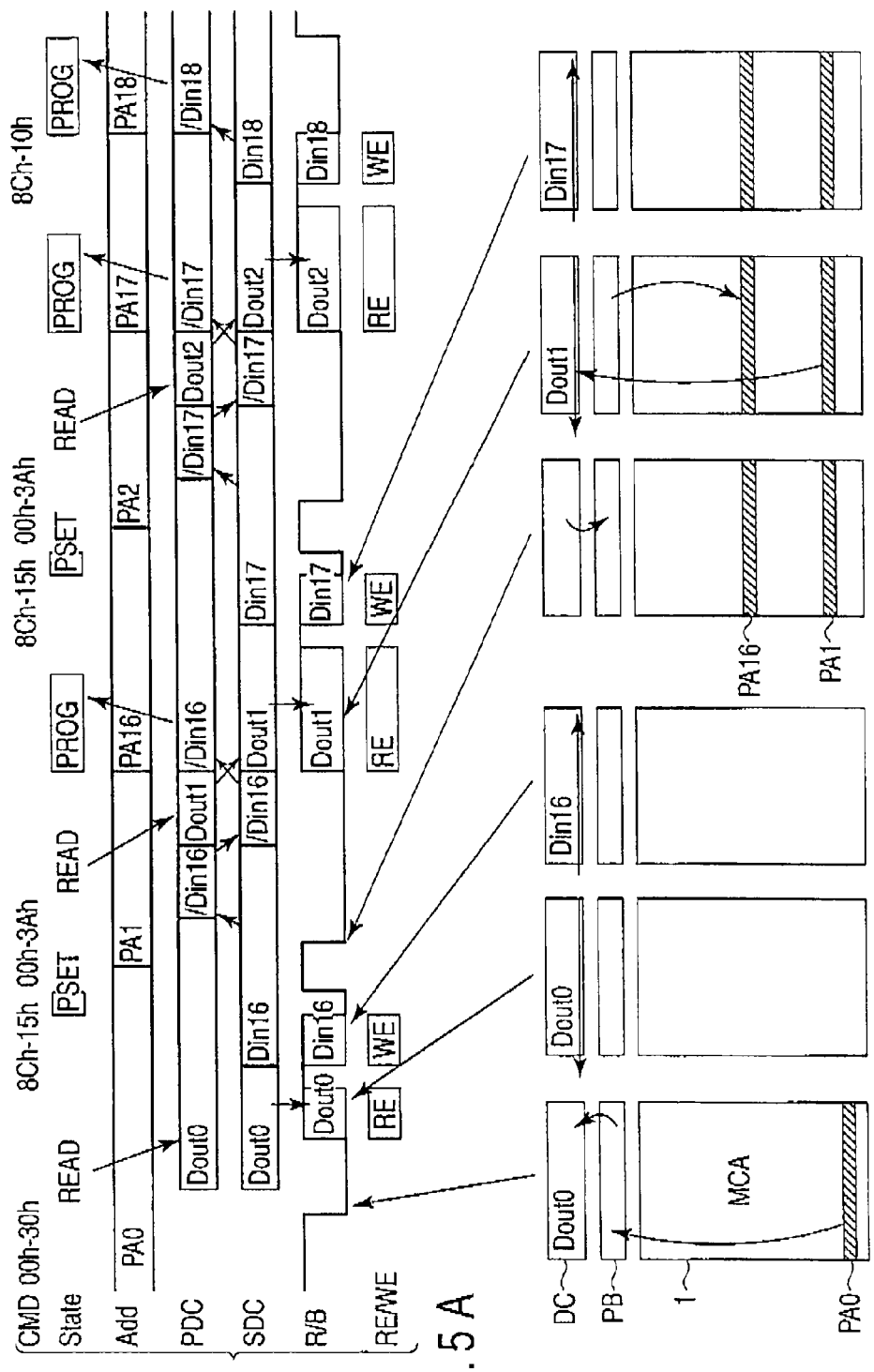
FIGS. 5A, 5B, 5C, 5D, 5E, 5F and 5G illustrate a page copy operation according to the first embodiment.

As shown in FIG. 5A and FIG. 5B, in the page copy, to start with, if the R/B is set at a low level (busy), based on the read commands "00h-30h", the data of a page address PA0 is read out from the memory cell array MCA. The read-out data is transferred to the data cache DC via the page buffer PB. Then, if the R/B rises to a high level (ready), the data of the data cache DC is transferred to the outside (FIG. 5C).

Next, based on the commands "8Ch-15h", a page address PA16 and data Din16, which is to be written at the data address PA16, are supplied, and the data Din16 is input to the data cache DC (FIG. 5D). The data Din16 is, for example, data Dout0 which is read out from the page address PA0 to the outside. In the case where error correction of the data Dout0 is performed by an ECC (Error Checking and Correcting) circuit, which is provided in, e.g. a controller on the outside of the NAND flash memory, data after error correction may be input as Din16.

Subsequently, the R/B is once set at the low level and then set at a high level, and preset is executed. Specifically, during the period in which the R/B is at low level, an operation is executed for taking the page address PA16 into an address register within the NAND flash memory. Thereafter, if the read of data Dout1 of the page address PA1 is started on the basis of the commands "00h-3Ah", the data Din16 of the data cache DC is inverted and transferred to the page buffer PB (FIG. 5E). Specifically, an inversion arithmetic operation of input data is performed at the same time as the data read operation, and write data /Din16 is generated. Subsequently, the write data /Din16 of the page buffer PB is transferred to the data cache DC, and the data Dout1, which is read out from the memory cell array MCA, is retained in the page buffer ET.

Then, the data Dout1 of the page buffer PB and the write data /Din16 of the data cache DC are exchanged, and the write data /Din16 of the page buffer PB is written in the memory cell array MCA. While the write data /Din16 is being written in the memory cell MCA, the data Dout1 of the data cache DC is output (FIG. 5F).

Subsequently, based on commands "8Ch-15h", the write data Din17, which is to be written at an address PA17, is input to the data cache DC (FIG. 5G). The data Din17 is, for example, the data Dout1 which is read out from the page address PA1 to the outside. In the case where error correction of the data Dout1 is performed by an ECC (Error Checking and Correcting) circuit, which is provided in, e.g. a controller on the outside of the NAND flash memory, data after error correction may be input as Din17.

Subsequently, in the same manner as described above, the page copy operation is executed.

In the case of the page copy operation illustrated in FIG. 5A to FIG. 5G, the arithmetic operation for converting the input data Din16 to the write data /Din16, as illustrated in FIG. 5D and FIG. 5E, is executed during the read operation of the page address PA1. Specifically, in the case of the page copy operation illustrated in FIG. 5A to FIG. 5G, the operation of "read (arithmetic operation)-program" is repeated. Thus, the time for the arithmetic operation for converting input data to write data (i.e. the period of State "EX" after the input of commands "8Ch-15h" illustrated in FIG. 4A) can be omitted. Therefore, the time of the page copy operation can be reduced.

Figure 6:
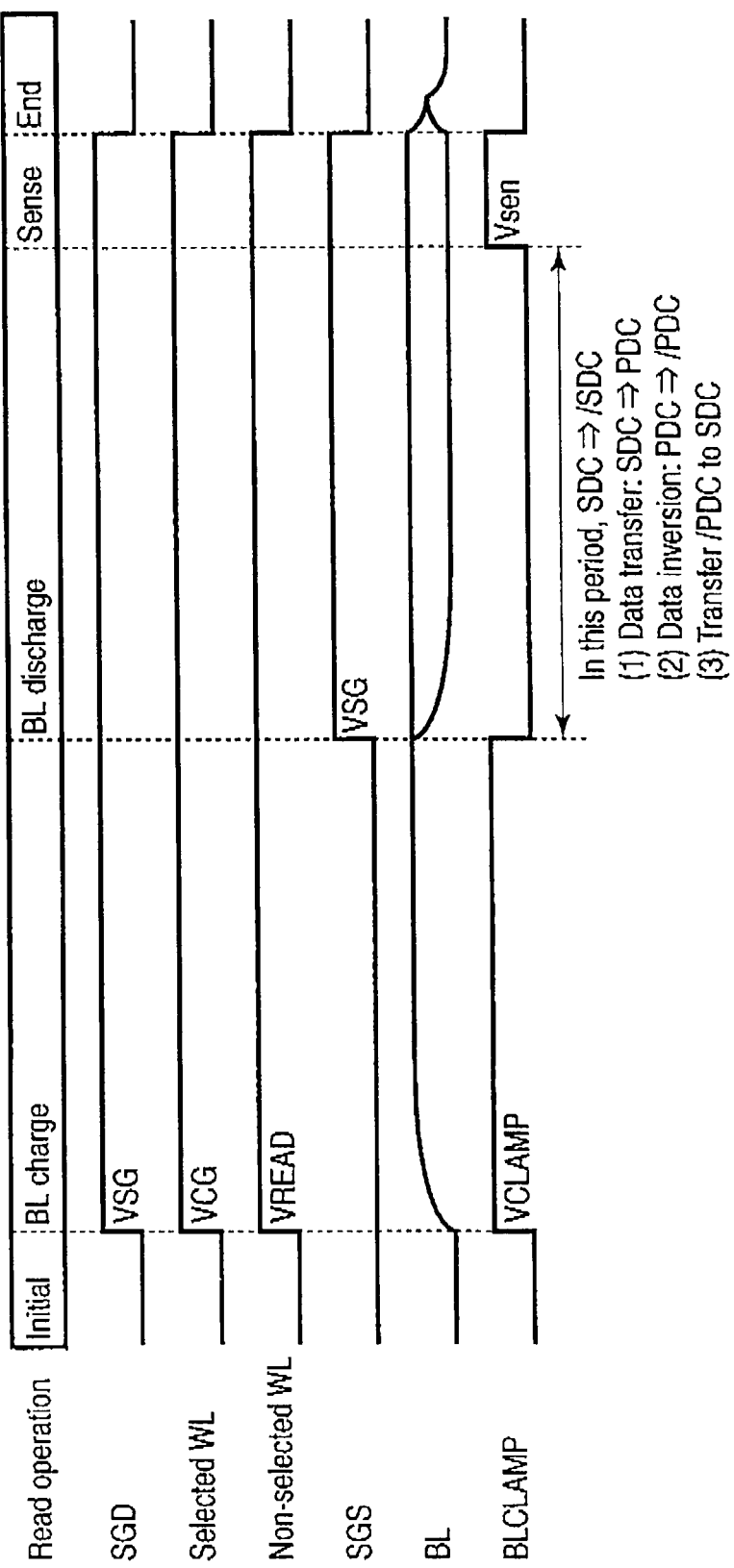
FIG. 6 is a timing chart illustrating a part of the operation illustrated in FIG. 5A to FIG. 5G.

FIG. 6 illustrates a data read operation in the page copy operation, and shows charge/discharge of bit lines and the potentials of the respective parts of the data memory circuit 10. FIGS. 7A, 7B and 7C and FIGS. 8A, 8B and 8C schematically illustrate the arithmetic operation of the data memory circuit 10 at the time of data read.

Figure 7A:
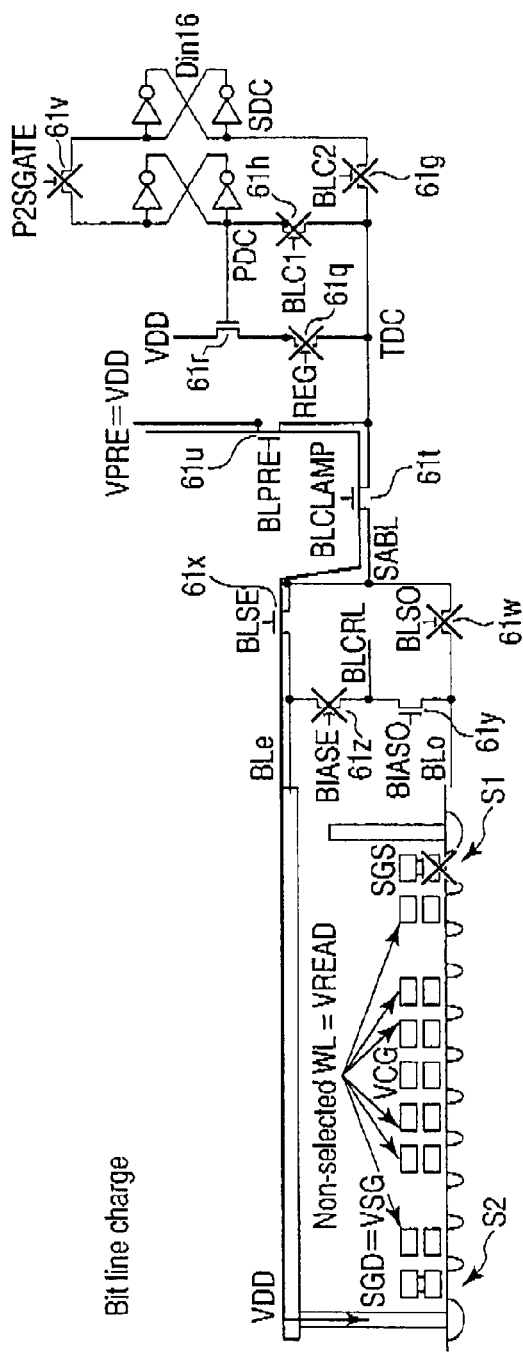
FIGS. 7A, 7B and 7C concretely illustrate a page copy operation according to the first embodiment.

As shown in FIG. 6 and FIG. 7A, at the time of data read, the potentials of the select line SGD of the select gate S2 of the memory cell array is set at VSG, and the select line SGS of the select gate S1 is set at VSS (ground potential). A selected word line is set at a read level VCG, and a non-selected word line is set at VREAD (a potential at which a cell with a highest threshold voltage can be turned on).

On the other hand, data Din16 is retained in the SDC which constitutes the data cache DC.

In this state, the signal VPRE, which is supplied to the other end of the current path of the transistor 61$u$, is set at, e.g. VDD, and the signals BLPRE, BLCLAMP, BLSE and BIASO, which are supplied to the gates of the transistors 61$u$, 61$t$, 61$x$ and 61$y$, are set at VCLAMP, for example, VDD+Vth (the threshold voltage of the N-channel MOS transistor).

Further, the signal BLC2 which is supplied to the gate of the transistor 61$g$, the signal BLC1 which is supplied to the gate of the transistor 61$h$, the signal REG which is supplied to the gate of the transistor 61$q$, the signal BLS0 which is supplied to the gate of the transistor 61W, the signal BIASE which is supplied to the gate of the transistor 61$z$, and the signal P2SGATE which is supplied to the gate of the transistor 61$v$ are set at a low level (e.g. VSS), respectively. Thus, the transistors, other than the transistors 61$u$, 61$t$ and 61$x$, are set in the OFF state. Accordingly, the bit line BLe is charged to VDD via the transistors 61$u$, 61$t$ and 61$x$.

Figure 7B:
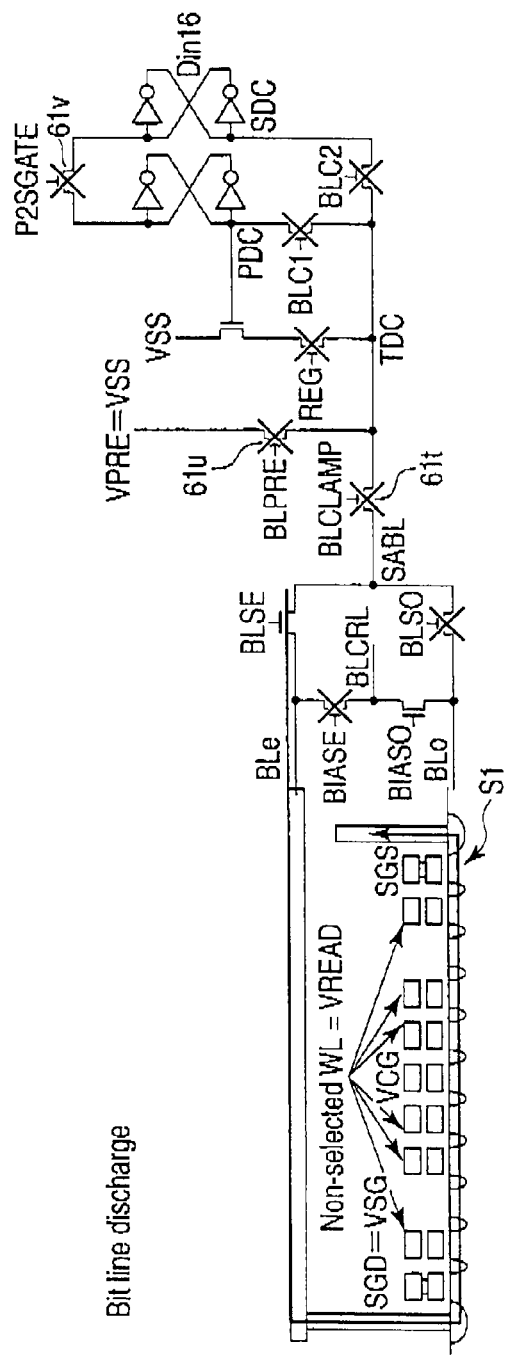

Subsequently, as shown in FIG. 6 and FIG. 7B, the select line SGS is set at VSG, and the signals VPRE, SLPRE and BLCLAMP are set at VSS, respectively. Thus, the transistors 61$u$ and 61$t$ are turned off, and the bit line and the TDC are cut off. In addition, VAG is supplied to the select gate S1, the select gate S1 is turned on, and a discharge path of the bit line is formed. In this state, in the case where the threshold voltage of the selected cell is higher than the read level VCG, the cell is turned off and the potential of the bit line is retained. Besides, in the case where the threshold voltage of the selected cell is lower than the read level VCG, the cell is turned on and the charge of the bit line is discharged to the source line via the select gate S1.

Figure 7C:
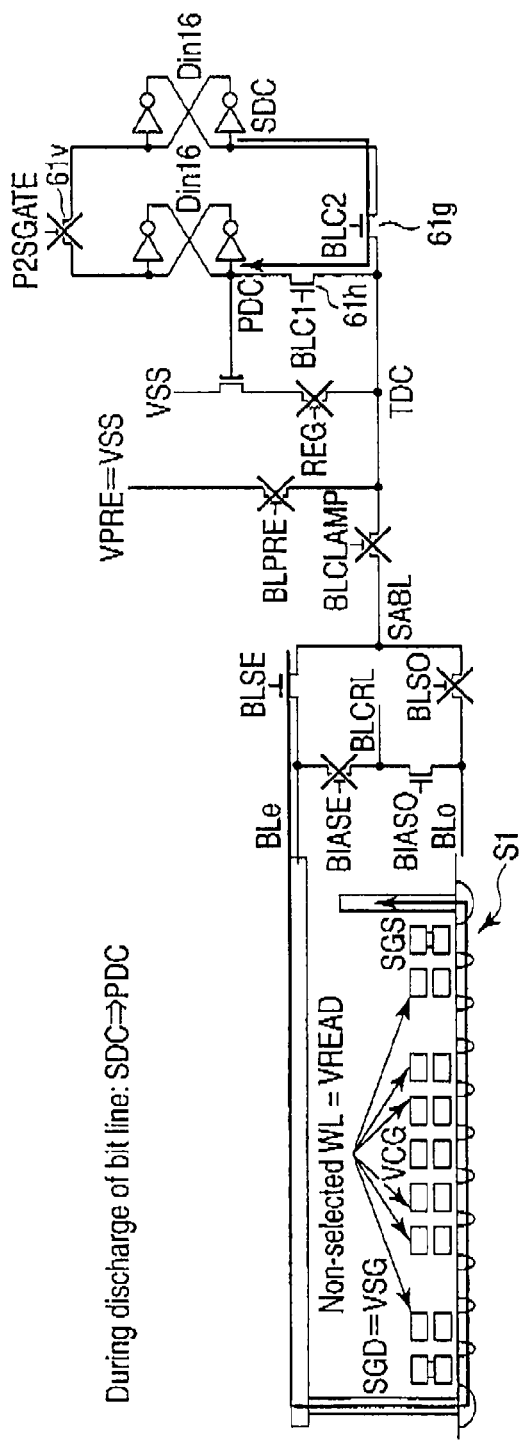

As shown in FIG. 6 and FIG. 7C, during the discharge of the bit line, the signals BLC1 and BLC2 are set at, e.g. VDD, and the data Din16, which is held in the SDC, is transferred to the PDC.

Figure 8A:
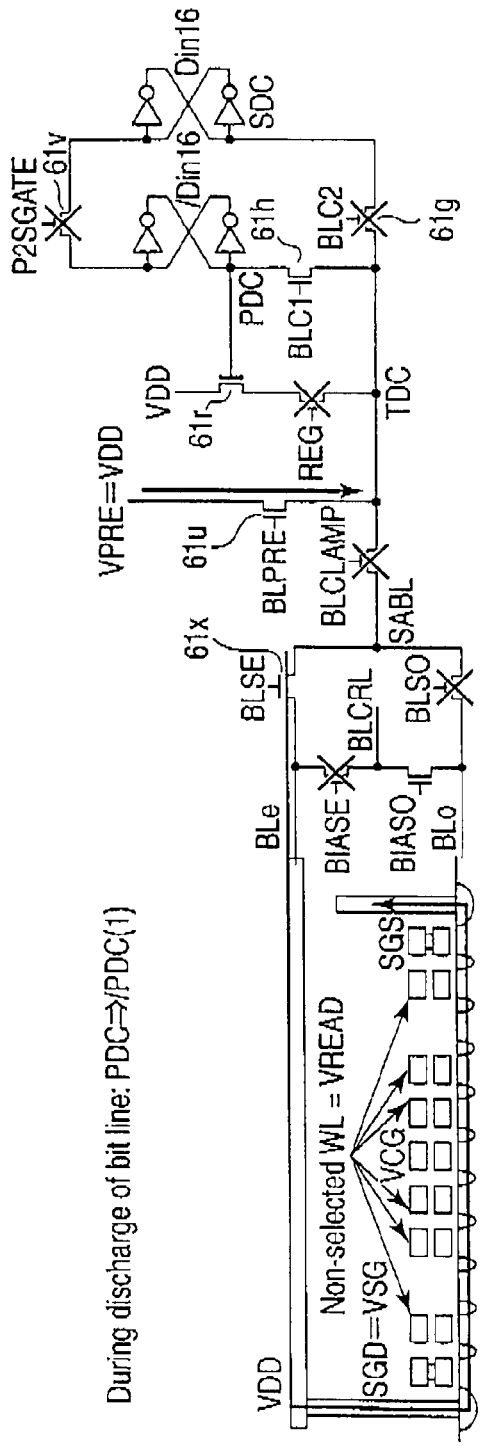
FIGS. 8A, 8B and 8C concretely illustrate a page copy operation which follows the page copy operation illustrated in FIG. 7C.

Subsequently, as shown in FIG. 8A, the signal BLC2 is set at VSS, the signal VPRE is set at VDD, the signal BLPRE is set at VDD+Vth, and the TDC is charged to VDD via the transistor 61$u$.

Figure 8B:
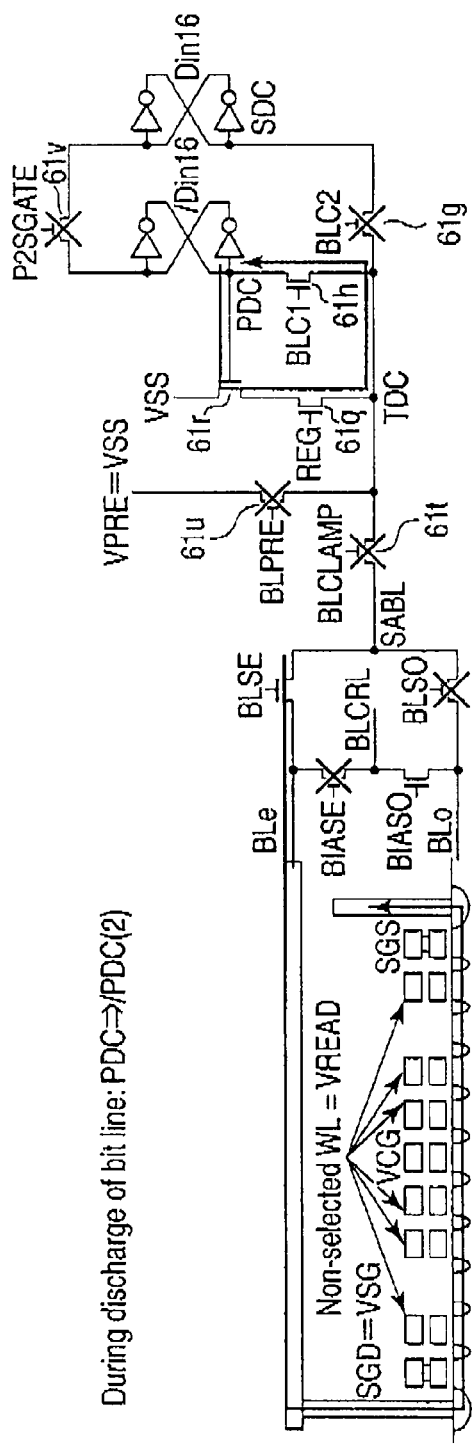

Subsequently, as shown in FIG. 8B, the signal VPRE and signal BLPRE are set at VSS, the signal REG is set at VDD, and the signal VPRE which is supplied to the transistor 61$r$ is set at VSS. In this state, if the PDC is at the high level (e.g. VDD), since the transistor 61$r$ is turned on, the charge of the PDC and TDC is released via the transistors 61$h$, 61$q$ and 61$r$. Accordingly, the PDC is inverted to the low level. In the case where the PDC is at the low level, since the transistor 61$r$ is turned off, the charge of the TDC is transferred to the PDC via the transistor 61$h$, and the PDC is inverted to the high level.

Figure 8C:
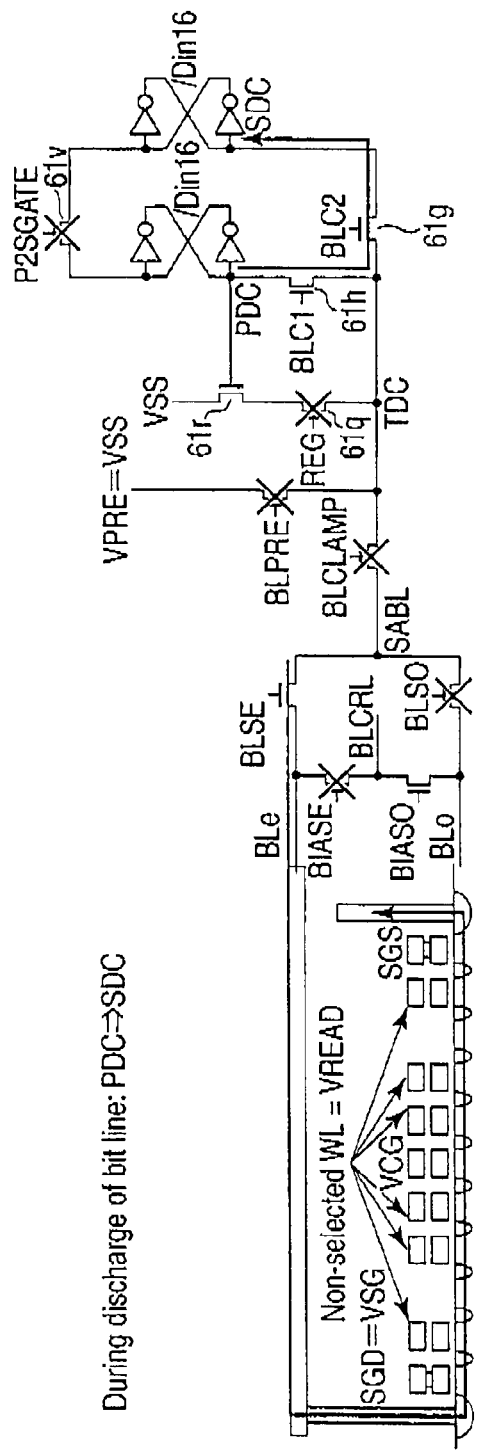

Then, as shown in FIG. 8C, the signal BLC2 is set at VDD, and the data of the PDC is transferred to the SDC via the transistors 61$h$ and 61$g$.

In this manner, at the time of data read, the data of the SDC can be transferred to the PDC while the bit line is being discharged, and the data of the PDC can be inverted and transferred to the SOC.

Subsequently, the signal BLC2 is set at VSS, the signal BLCLAMP is set at VDD+Vth, and the potential of the bit line is taken in the TDC. The potential of the TDC is transferred to the PDC via the transistor 61$h$. In this manner, the data Dout1, which is read out1 of the memory cell, is held in the PDC.

FIG. 9A, FIG. 9B and FIG. 9C illustrate operations of exchanging the data of the SDC and the data of the PDC prior to the program illustrated in FIG. 5A, setting the data Dout1 in the SDC, and setting write data /Din16 in the PDC.

As shown in FIG. 9A, to begin with, the signal BLC2, which is supplied to the gate of the transistor 61$g$, is set at, e.g. VDD. Accordingly, the transistor 61$g$ is turned on, and the data /Din16 retained in the SDC is transferred to the TDC via the transistor 61$g$. At this time, the transistors 61$h$, 61$q$, 61$t$, 61$u$ and 61$v$ are set in the OFF state.

Next, as shown in FIG. 9B, the signal BLC2, which is supplied to the gate of the transistor 61$g$, is set at, e.g. VSS, and the signal P2SGATE, which is supplied to the gate of the transistor 61v, is set at, e.g. VDD. Accordingly, the transistor 61g is turned off, and the transistor 61v is turned on. In this state, the data Dout1, which is retained in the PDC, is transferred to the SDC.

Thereafter, the signal P2SGATE, which is supplied to the gate of the transistor 61v, is set at VSS, and the BLC1, which is supplied to the gate of the transistor 61h, is set at VDD. Thus, the transistor 61v is turned off, and the transistor 61h is turned on. In this state, the write data /Din16, which is held in the TDC, is transferred to the PDC via the transistor 61h. By these operations, the write data /Din16 is set in the PDC, and the data Dout1 is set in the SDC (FIG. 9C).

According to the first embodiment, during the data read operation, while the bit line is being discharged, the arithmetic operation is performed for inverting the input data and generating the write data. Thus, an additional time, which is necessary for the arithmetic operation of write data, is not needed. Therefore, it is possible to reduce the time of the page copy operation in which data read and program are repeated.

In addition, while the bit line is being discharged, the arithmetic operation of the write data is executed and the write data is held in the SDC. Thus, after the discharge of the bit line, the data which is read out of the memory cell can immediately be held in the PDC. Therefore, it is possible to prevent an increase in time of the read operation itself, and to reduce the time of the page copy operation.

Second Embodiment

Figure 10:
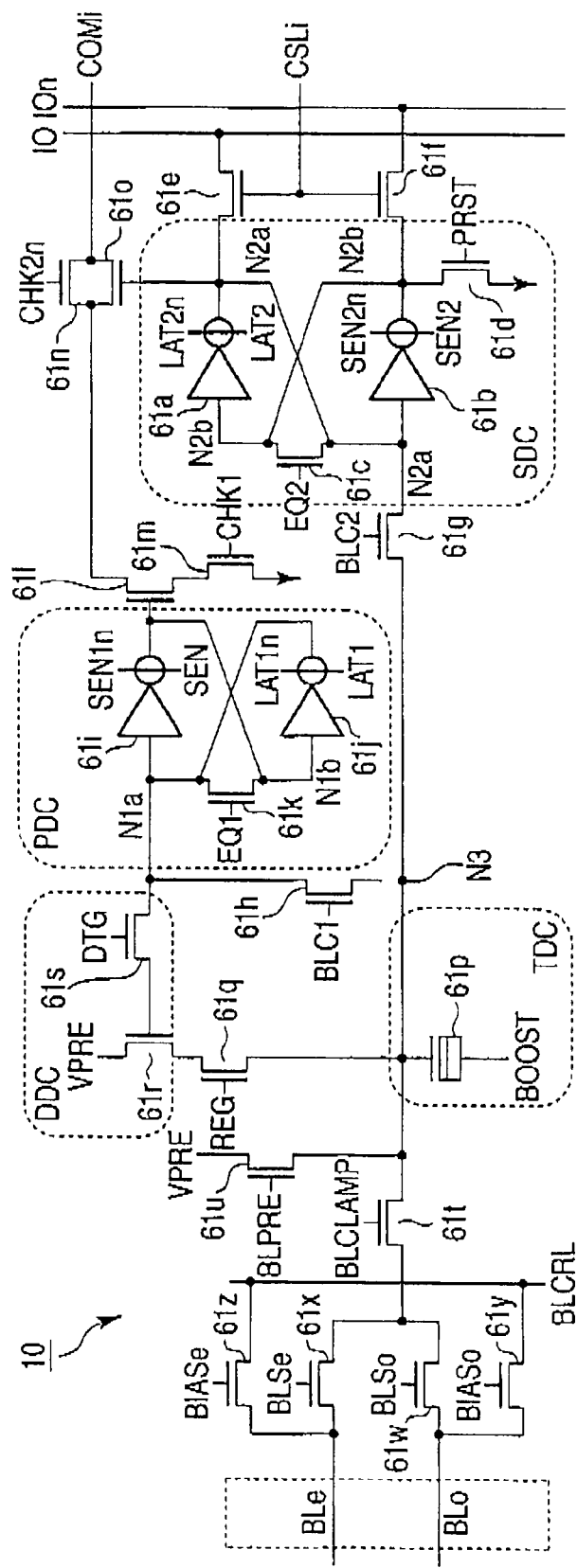
FIG. 10 is a circuit diagram showing a second embodiment, which is a modification of FIG. 3.

FIG. 10 illustrates an example of a data memory circuit 10 which is applied to a second embodiment. The second embodiment shows the case in which data of, e.g. 2 bits (four values) is stored in one cell. In FIG. 10, the parts common to those in FIG. 3 are denoted by like reference numerals.

FIG. 10 differs from FIG. 3 in that a dynamic data latch circuit (DDC) is provided between the PDC and the transistor 61q. The DDC comprises transistors 61r and 61s. One end of the current path of the transistor 61r is supplied with a signal VPRE, and the other end of the current path of the transistor 61r is connected to the current path of the transistor 61q. The gate of the transistor 61r is connected to the node N1a of the PDC via the transistor 61s. The gate of the transistor 61s is supplied with a signal DTG. The DOC temporarily stores data at a time of, e.g. verify, and is used for an operation of internal data when multi-value data is stored.

FIGS. 11A, 11B and 11C and FIGS. 12A, 12B and 12C illustrate a conversion operation for converting input data to write data, with use of the data memory circuit shown in FIG. 10. This conversion operation is basically the same as the operation illustrated in FIGS. 7A, 7B and 7C and FIGS. 8A, 8B and 8C.

Figure 11A:
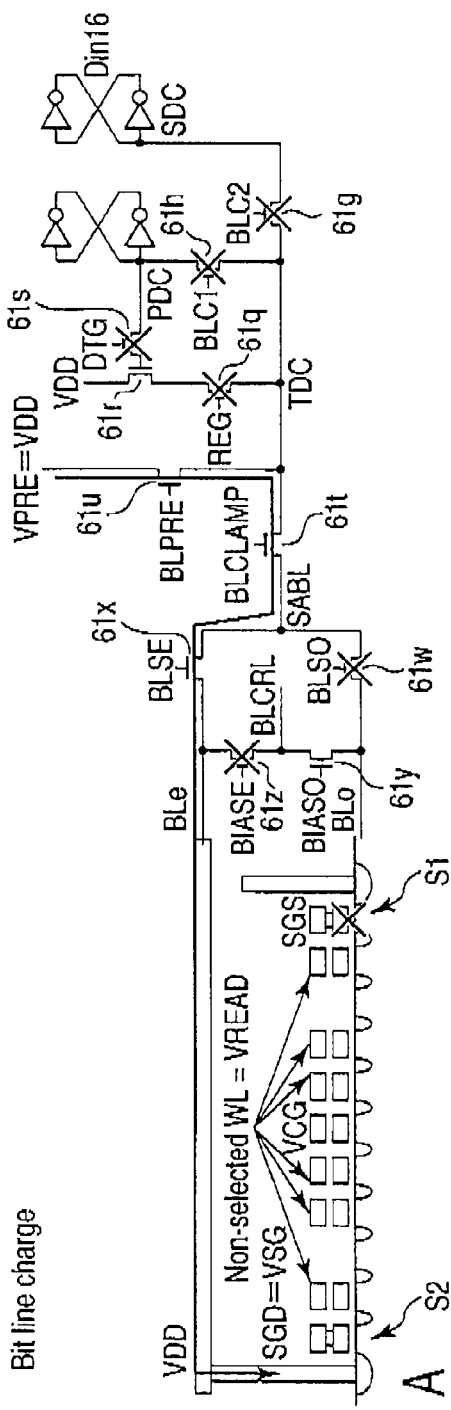

To start with, as shown in FIG. 11A, the signals BLC2, BLC1, REG, DTG, BLSO and BIASE are set at VSS, and the transistors 61g, 61h, 61q, 61s, 61w and 61z are turned off. In this state, the signals BLPRE, BLCLAMP, BLSE and BIASO are set at, e.g. VDD+Vth, the transistors 61u, 61t, 61x and 61y are turned on, and the bit line is charged up to VDD. In addition, the signal BIASO is set at, e.g. VDD+Vth, the transistor 61y is turned on, and the signal BLCRL (VDD) is supplied to the non-selected bit line.

Figure 11B:
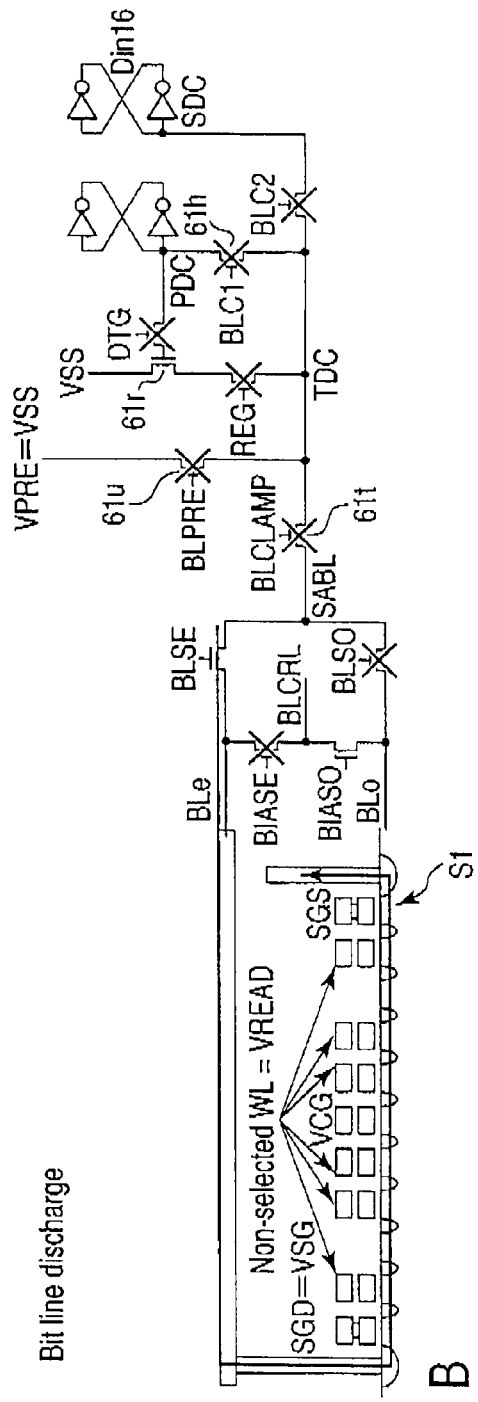

Then, as shown in FIG. 11B, the transistors 61t and 61u are turned off, the TDC is cut off from the bit line, the select gate S2 is turned on, and the potential of the bit line is discharged to the source line.

As shown in FIG. 11C, during the discharge of the bit line, the signals BLC2 and BLC1 are set at VDD, and the transistors 61g and 61h are turned on. Thus, the input data Din16, which is held in the SDC, is transferred to the PDC.

Subsequently, as shown in FIG. 12A, the signal BLC2 is set at VSS, and the transistor 61g is turned off. In addition, the signal BLPRE is set at VDD+Vth, the signal VPRE is set at VDD, and the TDC is charged to VDD via the transistor 61u.

Figure 12B:
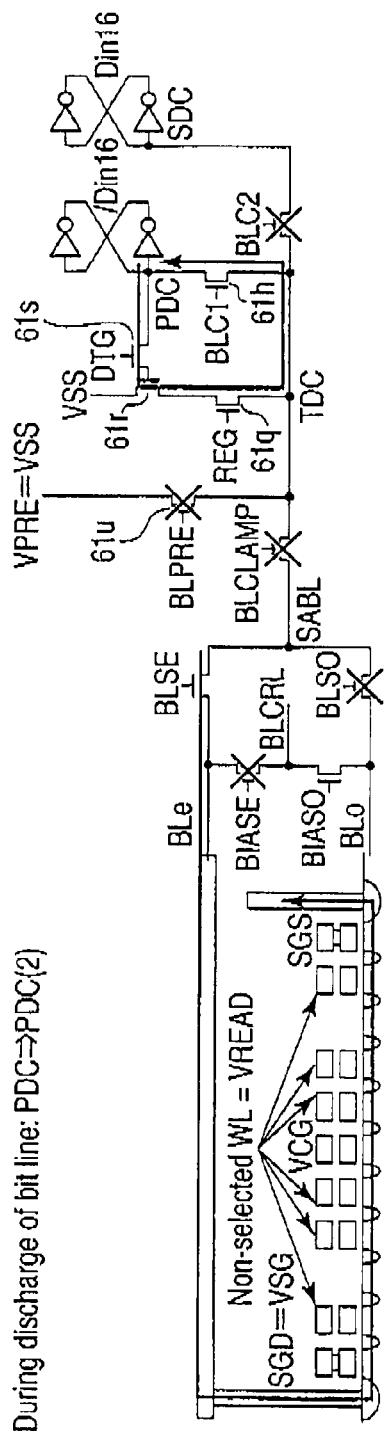
Figure 12C:
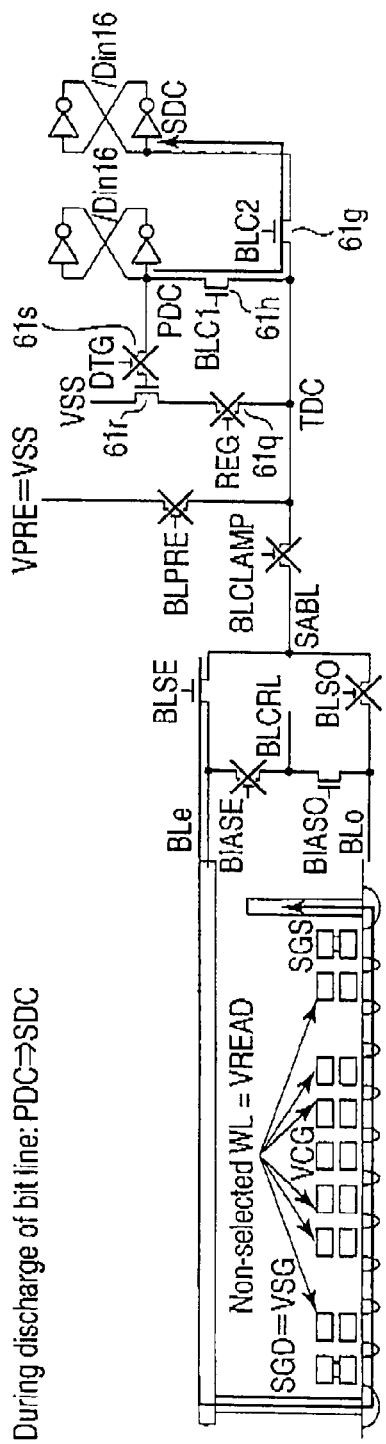

Then, as shown in FIG. 12B, the signal BLPRE and signal VPRE are set at VSS, and the transistor 61u is turned off. In addition, the signal REG and signal DTG are set at, e.g. VDD, and the transistors 61q and 61s are turned on.

In the case where the data of the PDC is at the high level, the gate of the transistor 61r is set at the high level via the transistor 61s. Accordingly, the transistor 61r is turned on. Thus, the charge of the TDC and PDC is discharged to VPRE=VSS via the transistors 61q, 61r and 61h. As a result, the data of the PDC is inverted to the low level (/Din16).

In the case where the PDC is at the low level, the gate of the transistor 61r is set at the low level via the transistor 61s. Thus, the transistor 61r is turned off. Accordingly, the charge of the TDC is supplied to the PDC via the transistor 61h, and the PDC is inverted to the high level (/Din16).

Then, the signals REG and DTG are set at VSS, the transistors 61q and 61s are turned off, and the signal BLC2 is set at VDD. Accordingly, the data of the PDC is transferred to the SDC via the transistors 61h and 61g.

In this manner, at the time of data read, the data of the SDC can be transferred to the PDC while the bit line is being discharged, and the data of the PDC can be inverted and transferred to the SDC.

Subsequently, the signal BLC2 is set at VSS, the signal BLCLAMP is set at VDD+Vth, and the potential of the bit line is taken in the TDC. The potential of the TDC is transferred to the PDC via the transistor 61h. In this manner, the data Dout1, which is read out of the memory cell, is held in the PDC.

FIG. 13A, FIG. 13B, FIG. 13C and FIG. 13D illustrate operations of exchanging the data of the SDC and the data of the PDC prior to the program illustrated in FIG. 5A, setting the data Dout1 in the SDC, and setting write data /Din16 in the PDC.

As shown in FIG. 13A, to begin with, the signal DTG, which is supplied to the gate of the transistor 61s, is set at, e.g. VDD. Accordingly, the transistor 61s is turned on, and the data Dout1 retained in the PDS is transferred to the gate of the transistor 61r, which constitutes the DDC, via the transistor 61s. At this time, the transistors 61g, 61h, 61q, 61t and 61u are set in the OFF state. In addition, the other end of the current path of the transistor 61r is set at, e.g. VSS.

Next, as shown in FIG. 13B, the signal DTG, which is supplied to the gate of the transistor 61s, is set at, e.g. VSS, and the signal BLC2, which is supplied to the gate of the transistor 61g, and the signal BLC1, which is supplied to the gate of the transistor 61h, are set at, e.g. VDD. Accordingly, the transistor 61s is turned off, and the transistors 61g and 61h are turned on. In this state, the data Din16, which is retained in the SDC, is transferred to the PDC.

Figure 13C:
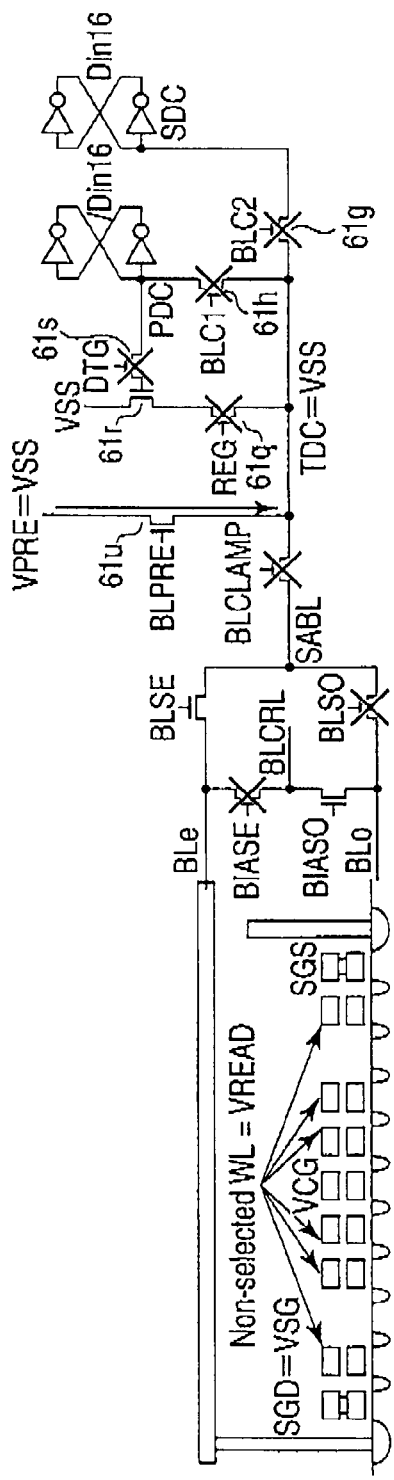

Thereafter, as shown in FIG. 13C, the BLC1, which is supplied to the gate of the transistor 61h, is set at VSS, and the transistor 61h is turned off. Then, the signal BLPRE, which is supplied to the transistor 61u, is set at, e.g. VDD, and the signal VPRE, which is supplied to the other end of the current path of the transistor 61u, is set at VSS. Accordingly, the transistor 61u is turned on and the TDC is set at VSS.

Figure 13D:
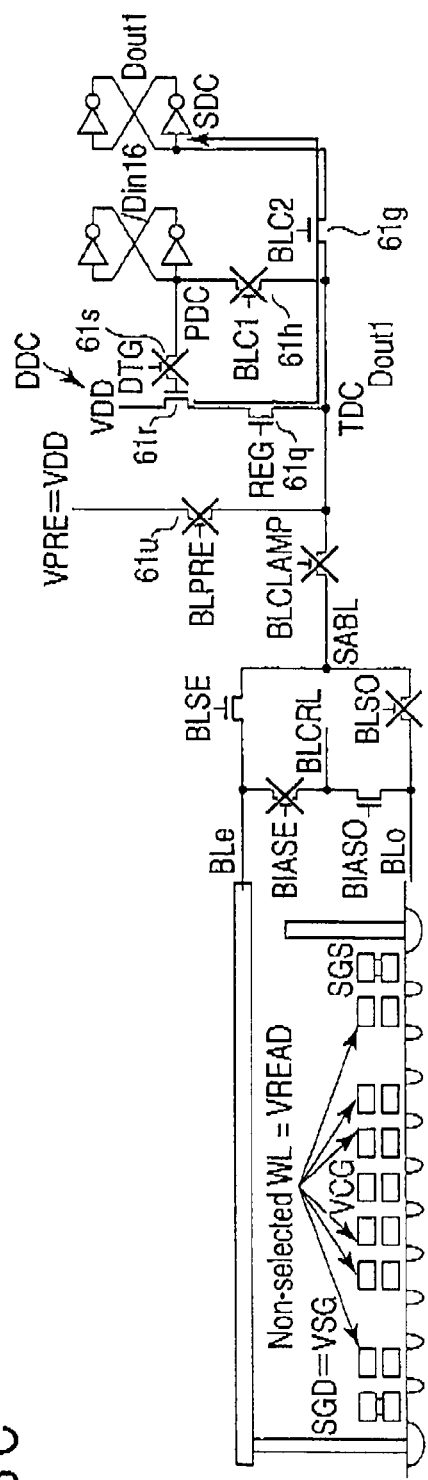

Subsequently, as shown in FIG. 13D, the signal BLPRE, which is supplied to the gate of the transistor 61u, is set at VSS, and the transistor 61u is turned off. Then, the signal VPRE, which is supplied to the other end of the current path of the transistor 61r, is set at VDD, and the signal REG, which is supplied to the gate of the transistor 61q, is set at VDD+Vth. Accordingly, the transistor 61q is turned on. In this state, when the gate (DDC) of the transistor 61r is at the high level (Dout1), the transistor 61r is turned on. Thus, the SDC is set at the high level (Dout1) via the transistors 61r, 61q, TDC, and 61g. On the other hand, when the gate (DDC) of the transistor 61r is at the low level (Dout1), the transistor 61r is turned off. Accordingly, the potential VSS of the TDC is set as Dout1 in the SDC. By these operations, the write data /Din16 is set in the PDC, and the data Dout1 is set in the SDC.

According to the second embodiment, during the data read operation, while the bit line is being discharged, the arithmetic operation is performed for inverting the input data and generating the write data. Thus, an additional time, which is necessary for the arithmetic operation of write data, is not needed. Therefore, even in the semiconductor memory device which stores multi-value data, it is possible to reduce the time of the page copy operation in which data read and program are repeated.

In the first and second embodiments, the page copy operation has been described. However, the embodiments are not limited to the page copy operation, and are applicable to other operations in which read and program operations are successively executed.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
  a memory cell array including a plurality of memory cells;
  first and second data caches configured to hold a first data, a second data, and a third data, the first data being read out from the memory cell array, the second data being supplied from outside the memory cell array, the third data being to be written to the memory cell array; and
  a control circuit configured to control a read operation and a write operation by using the first data cache and the second data cache, the control circuit being configured to generate the third data from the second data by an arithmetic operation during executing the read operation of the first data.

2. The device according to claim 1, further comprising:
  a plurality of bit lines electrically connected to the plurality of memory cells,
  wherein the control circuit is configured to generate the third data from the second data by the arithmetic operation when a selected bit line is being discharged.

3. The device according to claim 1, wherein the control circuit is configured to invert the second data held in the first data cache, the control circuit being configured to hold the third data generated from the second data in the second data cache.

4. The device according to claim 1, wherein in a copy operation of writing data, which is read out from a first address of the memory cell array, to a second address of the memory cell array, the control circuit is configured to execute, when data is read out from the memory cell array on the basis of the first address, an arithmetic operation of data which is to be written at a third address which is input earlier than the first address.

5. The device according to claim 1, further comprising a third data cache which is connected to the first and second data caches,
  wherein the control circuit is configured to execute, in the read operation, an arithmetic operation of the second data cache by using the first, second and third data caches, and to generate the third data.

6. The device according to claim 2, further comprising a first transistor which is connected between the first data cache and the second data cache, the first transistor being configured to be turned on while the bit line is being discharged and to transfer to the second data cache the write data held in the first data cache.

7. The device according to claim 6, further comprising a data inversion circuit connected to the second data cache, the data inversion circuit being configured to invert the data, which is held in the second data cache, while the bit line is being discharged, and to cause the second data cache to hold the inverted data.

8. The device according to claim 7, wherein the first transistor is configured to be turned on while the bit line is being discharged, and to transfer the inverted data, which is held in the second data cache, to the first data cache.

9. The device according to claim 7, wherein the data inversion circuit includes:
  a first transistor has a first gate connected to the second data cache and a first current path whose one end is supplied with a power;
  a second transistor has a second gate to which a first signal is supplied and a second current path whose one end is connected to another end of the first current path of the first transistor; and
  a third transistor has a third gate electrode to which a second signal is supplied, and third current path whose one end of the third current path is connected to another end of the second current path of the second transistor, and another end of the third current path is connected to the second data cache,
  wherein the data of the second data cache is inverted to a low level during discharge of the bit line when data of the second data cache is a high level, the second and third signals are a high level, and a power is a low level.

10. The device according to claim 9, further comprising:
  a fourth transistor having a fourth gate to which a third signal is supplied and a fourth current path whose one end is connected to the one end of the third current path, and another end of the fourth current path is connected to the first data cache,
  wherein the data of the second data cache is transferred to the first data cache during discharge of the bit line when the third and the fourth signals are set to the high level.

11. The device according to claim 8, further comprising a third data cache connected to a connection node between the first transistor and the second data cache.

12. The device according to claim 11, wherein the first transistor is configured to be turned on while the bit line is being discharged and to transfer the inverted data, which is held in the first data cache, to the third data cache.

13. The device according to claim 12, further comprising a second transistor which is connected between the first data cache and the second data cache, the second transistor being configured to transfer to the first data cache the data which is read out from the memory cell while the bit line is being discharged and is held in the second data cache.

14. A control method of a semiconductor memory device, comprising
- holding a first data, a second data, and a third data, the first data being read out from the memory cell array, the second data being supplied from outside the memory cell array, the third data being to be written to the memory cell array; and
- executing a read operation and a write operation by using the first data cache and the second data cache, the control circuit being configured to generate the third data from the second data by an arithmetic operation during executing the read operation of the first data.

15. The method according to claim 14, further comprising:
- electrically connecting a plurality of bit lines to the plurality of memory cells; and
- generating the second data from the third data by the arithmetic operation when a selected bit line is being discharged.

16. The method according to claim 14, further comprising inverting the second data held in the first data cache, and holding the third data generated from the second data in the second data cache.

17. The method according to claim 14, wherein in a copy operation of writing data, which is read out from the memory cell array, in the memory cell array, an arithmetic operation is executed by using the first and second data caches when the data is read out from the memory cell array.

18. The method according to claim 14, further comprising:
- providing a third data cache which is connected to the first and second data caches; and
- at a time of the read operation, executing an arithmetic operation of the second data cache by using the first, second and third data caches, and generating the third data.

* * * * *